United States Patent [19]

Kurp et al.

[11] Patent Number: 5,699,026
[45] Date of Patent: Dec. 16, 1997

[54] COMPONENT WORKING WITH SURFACE ACOUSTIC WAVES

[75] Inventors: Stefan Kurp; Christoph Hartel; Werner Ruile, all of München; Leonhard Reindl, Prutting; Peter Zibis, Hoehenkirchen-Siegertsbrunn; Jürgen Machui, München, all of Germany

[73] Assignee: Siemens Aktiengesellschaft, Munich, Germany

[21] Appl. No.: 526,631

[22] Filed: Sep. 11, 1995

Related U.S. Application Data

[63] Continuation of PCT/DE94/00263, Mar. 11, 1994.

[30] Foreign Application Priority Data

Mar. 11, 1993 [DE] Germany ............... 43 07 726.9

[51] Int. Cl.$^6$ ................................... H03H 9/64
[52] U.S. Cl. ........................... 333/193; 310/313 R
[58] Field of Search ...................... 333/150–153, 333/193–196; 310/313 R, 313 B, 313 D

[56] References Cited

U.S. PATENT DOCUMENTS 4,203,082  5/1980  Tsukamoto et al. ............... 333/194
4,438,417  3/1984  Yamashita et al. ............... 333/193

FOREIGN PATENT DOCUMENTS 0064506   9/1985  European Pat. Off. .
4115702  11/1992  Germany .
2088167   6/1982  United Kingdom .

OTHER PUBLICATIONS

Patent Abstracts of Japan, vol. 15, No. 157 (E–1058) Apr. 1991 & JP-A-3029407 (Mitsubishi) Feb. 7, 1991.

Patent Abstracts of Japan, vol. 16, No. 215 (E–1204) May 20, 1992 & JP-A-4035312 (Murata) Feb. 6, 1992.

Patent Abstracts of Japan, vol. 16, No. 432 (E–1262) Sep. 1992 & JP-A-4150512 (Japan Radio Co) May 25, 1992.

*Primary Examiner*—Benny Lee
*Assistant Examiner*—Darius Gambino
*Attorney, Agent, or Firm*—Herbert L. Lerner; Laurence A. Greenberg

[57] ABSTRACT

An interdigital converter of a surface acoustic wave filter is internally protected against electrostatic discharges. The protection is provided by a resistor which is connected in parallel to the interdigital converter.

4 Claims, 1 Drawing Sheet

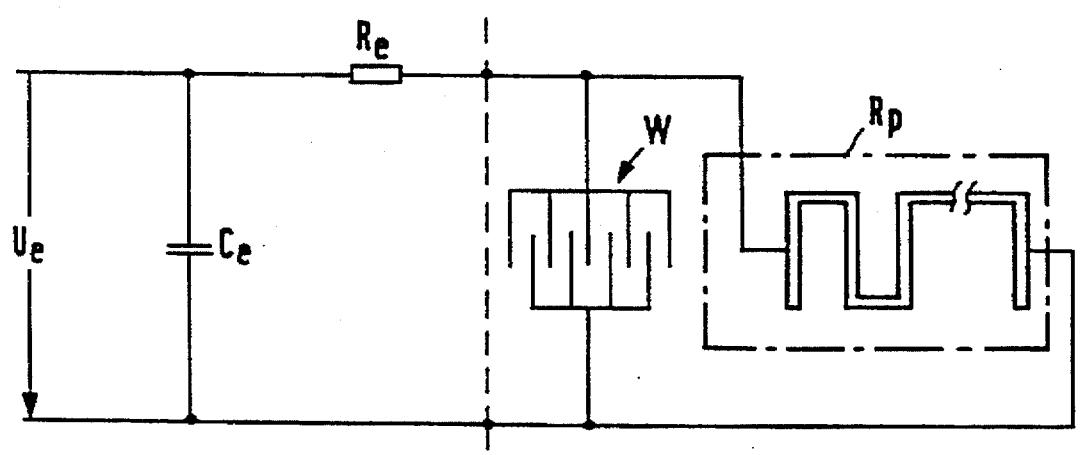

COMPONENT WORKING WITH SURFACE ACOUSTIC WAVES

CROSS-REFERENCE TO RELATED APPLICATION

This application is a continuation of international application PCT/DE94/00263, filed Mar. 11, 1994.

BACKGROUND OF THE INVENTION

Field of the Invention

The invention relates to a component working with surface acoustic waves (SAW), and in particular a surface wave filter with at least one interdigital converter.

Surface acoustic wave filters, in particular filters having fine structures, are sensitive to electrostatic discharges. If such filters are touched by electrostatically charged parts in practice, then they can be destroyed by these parts being discharged via an interdigital converter which is included in the filter.

The problems associated with such discharges have been heretofore prevented in that any contact of that kind has been avoided as much as possible between the surface acoustic wave filters and electrostatically charged parts. These safeguard procedures applied during production, during measurements, and in equipment in which they are used.

However, touching between such components cannot be reliably prevented in practice.

SUMMARY OF THE INVENTION

It is accordingly an object of the invention to provide a component working with surface acoustic waves, which overcomes the above-mentioned disadvantages of the heretofore-known devices and methods of this general type. Based on the premise that contact cannot be reliably prevented in practice, the present invention is based on the object of refining the filters themselves such that it is not possible for them to be destroyed if they are touched by electrostatically charged parts.

With the foregoing and other objects in view there is provided, in accordance with the invention, an improved surface acoustic wave filter of the type having at least one interdigital converter. The improvement which comprises: a resistor connected in parallel with the interdigital converter for protection against electrostatic discharge.

In accordance with an added feature of the invention, the filter is formed on a substrate, and the resistor is a parallel resistor integrated on the substrate of the component, the resistor being in the form of a resistance film.

In accordance with another feature of the invention, the resistance film has the form of a meandering line.

In accordance with again another feature of the invention, the interdigital converter has an intrinsic capacitance which, together with the resistor, defines a first time constant, and the filter further comprises a voltage source in the form of an electrostatically charged part, the voltage source having an internal resistance and an external capacitance defining a second time constant, the second time constant being long in comparison with the first time constant.

In view of the above objects there is also provided, in accordance with the invention, an electronic component working with surface acoustic waves, comprising at least one interdigital converter, and a resistor connected in parallel with the interdigital converter for protection against electrostatic discharge resulting from contact between the component and an electrostatically charged part.

Other features which are considered as characteristic for the invention are set forth in the appended claims.

Although the invention is illustrated and described herein as embodied in a component working with surface acoustic waves, it is nevertheless not intended to be limited to the details shown, since various modifications and structural changes may be made therein without departing from the spirit of the invention and within the scope and range of equivalents of the claims.

The construction of the invention, however, together with additional objects and advantages thereof will be best understood from the following description of the specific embodiment when read in connection with the accompanying drawings.

BRIEF DESCRIPTION OF THE DRAWING

The sole FIGURE of the drawing is a schematic of a surface wave filter with a protective configuration according to the invention.

DESCRIPTION OF THE PREFERRED EMBODIMENTS

Referring now to the FIGURE of the drawing in detail, there is shown a schematic equivalent circuit of a surface acoustic wave filter according to the invention, and of a voltage source which is formed by an electrostatically charged part.

An surface acoustic wave filter is illustrated on the right-hand side of a dashed vertical line. Since such surface acoustic wave filters are known per se, only one interdigital converter W of such a filter is illustrated.

According to the invention, a resistor $R_p$ is connected in parallel with the interdigital converter (W). Discharge currents can flow through the resistor $R_p$ if the filter is touched by an electrostatically charged part. As a consequence, destructive electrical flashovers in the filter are avoided.

An external voltage source which is provided by an electrostatically charged part is illustrated in the FIGURE on the left-hand side of the dashed vertical line by an equivalent voltage source having an external voltage $U_e$, an intrinsic capacitance $C_e$ and an internal resistance $R_e$.

Optimized dimensioning of the parallel resistor $R_p$ is governed by two contradictory conditions, i.e. two limits in opposite directions. On the one hand, the value of the parallel resistor $R_p$ must be large in comparison with the impedance of the interdigital converter W. This condition ensures that the normal operation of the component is not disturbed in any appreciable manner. On the other hand, in the event of a discharge resulting from contact with an electrostatically charged part, charges must not be able to flow away via the parallel resistor $R_p$ for a longer period than the discharging of the external capacitance $C_e$.

If the time constant $R_e \cdot C_e$ of the external voltage source is designated $t_e$, and the time constant $R_p \cdot C_i$ (where $C_i$ is the intrinsic capacitance of the interdigital converter W) of the filter which is provided with the parallel resistor $R_p$ is designated $t_i$, then $t_e$ should be large in comparison with $t_i$ ($t_e \gg t_i$) in a development of the invention.

In a preferred embodiment of the invention, the parallel resistor $R_p$ is expediently provided on the substrate of the filter, i.e. as an integrated resistance film. The resistor of this embodiment may have the form of a meandering line, as schematically illustrated in the FIGURE.

For a surface acoustic wave filter in the form of a bandpass filter at 480 MHz for satellite receivers, practically experiments have shown that good results are achieved with the parallel resistor $R_p$ having values in the range from 1.5 to 3 k$\Omega$. For example, a considerably improved limit voltage of Umax=150 V has been achieved in such bandpass filters with the resistance chosen at 3 k$\Omega$.

We claim:

1. A surface acoustic wave filter, comprising at least one interdigital converter having an intrinsic capacitance, a resistor connected in parallel with said interdigital converter for protection against electrostatic discharge when the acoustic wave filter comes into contact with an electrostatically charged part, said resistor and the intrinsic capacitance of said interdigital converter together defining a first time constant, and a voltage source in the form of an electrostatically charged part, said voltage source having an internal resistance and an external capacitance defining a second time constant, said second time constant being long in comparison with said first time constant.

2. The surface wave filter according to claim 1, wherein the filter is formed on a substrate, and said resistor is a parallel resistor integrated on the substrate of the component, said resistor being in the form of a resistance film.

3. The surface wave filter according to claim 2, wherein said resistance film has the form of a meandering line.

4. An electronic component working with surface acoustic waves, comprising at least one interdigital converter having an intrinsic capacitance, a resistor connected in parallel with said interdigital converter for protection against electrostatic discharge resulting from contact between the component and an electrostatically charged part, said resistor and the intrinsic capacitance of said interdigital converter together defining a first time constant, and a voltage source in the form of an electrostatically charged part, said voltage source having an internal resistance and an external capacitance defining a second time constant, said second time constant being long in comparison with said first time constant.

* * * * *